(12) United States Patent
Gerss et al.

(10) Patent No.: US 6,673,189 B2
(45) Date of Patent: Jan. 6, 2004

(54) METHOD FOR PRODUCING A STABLE BOND BETWEEN TWO WAFERS

(75) Inventors: Matthias Gerss, Wernberg (AT); Friedrich Kröner, Villach (AT)

(73) Assignee: Infineon Technologies AG, Munich (DE)

( * ) Notice: Subject to any disclaimer, the term of this patent is extended or adjusted under 35 U.S.C. 154(b) by 220 days.

(21) Appl. No.: 09/883,810

(22) Filed: Jun. 18, 2001

(65) Prior Publication Data

US 2001/0054480 A1 Dec. 27, 2001

(30) Foreign Application Priority Data

Jun. 16, 2000 (DE) .......................... 100 29 791

(51) Int. Cl.[7] .............................................. H01L 21/58
(52) U.S. Cl. ...................... 156/276; 438/456; 438/458; 438/459
(58) Field of Search ................................ 156/153, 154, 156/155, 247, 276, 280, 344; 438/455, 458, 459, 456

(56) References Cited

U.S. PATENT DOCUMENTS

| 5,340,435 A | * | 8/1994 | Ito et al. ............ 438/459 |
| 5,514,235 A | * | 5/1996 | Mitani et al. ........ 438/455 |
| 5,804,086 A | | 9/1998 | Bruel |
| 5,981,360 A | | 11/1999 | Rabarot et al. |
| 6,110,843 A | * | 8/2000 | Chien et al. ........ 438/782 |
| 6,127,243 A | * | 10/2000 | Werner et al. ....... 438/456 |
| 6,406,636 B1 | * | 6/2002 | Vaganov ............ 216/2 |
| 2001/0055881 A1 | | 12/2001 | Laermer et al. |

FOREIGN PATENT DOCUMENTS

| DE | 36 25 596 A1 | 2/1987 |
| DE | 39 37 810 C1 | 3/1991 |
| DE | 198 03 013 A1 | 8/1999 |
| EP | 0 890 982 A2 | 1/1999 |
| FR | 2 751 467 A1 | 1/1998 |
| GB | 2 179 001 A | 2/1987 |
| JP | 06 314 718 A | 11/1994 |

OTHER PUBLICATIONS

Tatyana S. Argunova et al.: "Interfacial Properties of Silicon Structures Fabricated by Vacuum Grooved Surface Bonding Technology", Jpn. J. Appl. Phys., vol. 37, Part 1 No. 12A, Dec. 1998, pp. 6287–6289.

* cited by examiner

Primary Examiner—Michael W. Ball
Assistant Examiner—John T. Haran
(74) Attorney, Agent, or Firm—Laurence A. Greenberg; Werner H. Stemer; Gregory L. Maybeck

(57) ABSTRACT

A method for producing a re-releasable bond between two wafers which is stable at high temperatures and mechanically stable is described. The two wafers to be bonded are placed one on top of the other in such a way that a surface of the first wafer is disposed on a surface of the second wafer. Interspaces at least partially connecting the surfaces are created between the wafers. A liquid glass compound is introduced into the interspaces in such a way that a liquid glass film wetting the inner surfaces of the interspaces is formed, in which process voids that are connected to the atmosphere surrounding the wafers remain inside the interspaces wetted with the liquid glass compound. To transform the wetting liquid glass film into a solid silicon dioxide film, the wafers lying one on top of the other are subjected to a temperature treatment.

19 Claims, 2 Drawing Sheets

METHOD FOR PRODUCING A STABLE BOND BETWEEN TWO WAFERS

BACKGROUND OF THE INVENTION

1. Field of the Invention

The invention relates to a method for producing a re-releasable bond between two wafers which is stable at high temperatures and is mechanically stable.

Modern semiconductor devices are increasingly produced on very thin semiconductor bodies, including ones that are thinner than 100 µm. Typically used for this purpose are conventional wafers that have a thickness of 500–700 µm and are ground until thin before the production of the semiconductor devices.

However, on account of their mechanical properties, such ultrathin wafers are very difficult to handle and therefore cannot be handled by the same production machines and transporting and securing devices as wafers of a standard thickness. It is therefore necessary to provide production machines and transporting devices which are modified specifically for ultrathin wafers, are configured for special wafer cassettes and have gripping devices for feeding the production machines that are configured specifically for ultrathin wafers and usually have to be operated manually. Furthermore, here the devices for fixing the ultrathin wafers during the actual production process, such as for example chucks, are converted for the requirements of the ultrathin wafers, which is laborious to various extents. There are, however, narrow limits to the modification of production machines for the purposes of handling ultrathin wafers, on account of their increasing complexity.

For all these reasons mentioned, the provision of new or modified production machines for the handling of ultrathin wafers is extremely complex and cost-intensive.

A significantly more simple method for producing and handling ultrathin wafers is described below.

A first wafer, known as the product wafer, on which the semiconductor devices are later to be applied and which therefore is to be ground until ultrathin, is placed and fastened in an interlocking manner onto a second wafer, known as the support wafer. The product wafer can then be ground until thin and the semiconductor devices can be introduced into the thin-ground product wafer using the corresponding production technology. Finally, the product wafer can be re-detached from the support wafer.

The interlocking and frictionally engaging bond is created here for example by a wax or adhesive bond or by a two-sided adhesive film disposed between the support wafer and the product wafer. The disadvantage of this method is that the interlocking and frictionally engaging bond is configured only for very low temperatures. At high temperatures, typical for the semiconductor process technology, the bond of wax, adhesive or film would however come apart again, that is to say a temperature-stable bond between the two wafers is no longer ensured here. In addition, if the materials mentioned above are used, foreign atoms could diffuse into the semiconductor body and contaminate it undesirably.

SUMMARY OF THE INVENTION

It is accordingly an object of the invention to provide a method for producing a stable bond between two wafers which overcomes the above-mentioned disadvantages of the prior art methods of this general type, which is stable at high temperatures and is mechanically stable.

With the foregoing and other objects in view there is provided, in accordance with the invention, a method for producing a re-releasable bond being stable at high temperatures and being mechanically stable. The method includes the step of placing two wafers to be bonded one on top of another such that a surface of a first wafer is disposed on a surface of a second wafer, resulting in a creation of interspaces between the two wafers. The interspaces at least partially connecting the surface of the first wafer to the surface of the second wafer. A liquid glass compound is introduced into the interspaces forming a liquid glass film wetting inner surfaces of the interspaces. In the process, voids connected to an atmosphere surrounding the two wafers remain inside the interspaces wetted with the liquid glass compound. The two wafers lying one on top of the other are subjected to a temperature treatment to transform the liquid glass film into a solid silicon dioxide film.

The present method makes it possible for the two wafers to be bonded to each other according to the invention with a bond which is mechanically stable and is stable at high temperatures in a very simple but nevertheless effective way such that a product wafer as is known can subsequently be ground until thin and further processed. For the further processing of the product wafer, all the equipment of conventional silicon technology can be advantageously used, that is to say no additionally modified production machines or transporting devices for handling the thin-ground wafers are required here. The special advantage of the present invention is that the wafers bonded to each other by a thin silicon dioxide film can be detached from each other again very simply—for example by a hydrofluoric acid compound.

In accordance with an added mode of the invention, there is the step of carrying out the temperature treatment step for turning the liquid glass film into the solid silicon dioxide film at a temperature of between 120° C. and 450° C.

In accordance with an additional mode of the invention, there is the step of subjecting the two wafers lying one on top of the other to a uniform pressure over a large surface area during the temperature treatment step.

In accordance with another mode of the invention, there is the step of using the first wafer as a support for the second wafer. The second wafer, on which semiconductor devices to be created are provided, is ground until thin or etched until thin after the production of the bond.

In accordance with a further mode of the invention, there is the step of forming trenches running in a plane of one of the surface of the first wafer and the surface of the second wafer. The trenches can be formed such that they run at least one of parallel and perpendicular to one another. The trenches have a depth of from 2 µm to 10 µm and are disposed at a distance of from 1 µm to 10 µm from one another.

In accordance with another added mode of the invention, there is the step forming the trenches to have a cross section being a rectangular cross section or a trapezoidal cross section.

In accordance with another additional mode of the invention, there is the step of disposing a multiplicity of fibers between the two wafers, and regions between neighboring fibers forming the interspaces.

In accordance with a further added mode of the invention, there are the steps of applying a layer of the liquid glass compound to one of the two wafers; subsequently placing the two wafers one on top of the other in an interlocking and frictionally engaging manner to create the liquid glass film; and spinning off excess liquid glass compound located in the interspaces by high-speed rotation of the two wafers, utilizing a centrifugal force.

In accordance with an added mode of the invention, there are the steps of placing the two wafers one on top of the other in an interlocking and frictionally engaging manner; disposing the two wafers in a liquid glass reservoir such that the liquid glass compound can penetrate into the interspaces, utilizing capillary suction; and spinning off excess liquid glass compound located in the interspaces by high-speed rotation of the two wafers, utilizing centrifugal force to create the liquid glass film.

In accordance with another mode of the invention, there are the steps of forming a through hole in at least one of the two wafers; placing the two wafers one on top of the other in an interlocking and frictionally engaging manner; spinning off the liquid glass compound through the through hole into the interspaces between the two wafers; and spinning off excess liquid glass compound located in the interspaces by high-speed rotation of the two wafers, utilizing centrifugal force, to create the liquid glass film.

In accordance with another mode of the invention, there is the step of placing a fiber mat produced from a fibrous material between the two wafers, regions between fibers of the fiber mat forming the interspaces.

In accordance with a further mode of the invention, there are the steps of performing one of impregnating and wetting the fiber mat with the liquid glass compound before the fiber mat is placed between the two wafers; subjecting the fiber mat impregnated with the liquid glass compound to a high-speed rotational movement normal to its plane, utilizing centrifugal force to adjust a film thickness of the fiber mat; and subsequently, placing the fiber mat in an interlocking and frictionally engaging manner between the two wafers.

In accordance with a another added mode of the invention, there is the step of storing the fiber mat impregnated with the liquid glass compound under refrigerated conditions until the temperature treatment step to create the silicon dioxide film is performed.

In accordance with another additional mode of the invention, there are the steps of impregnating the fiber mat with the liquid glass compound at an elevated temperature; spinning the liquid glass compound onto the wafers at an elevated temperature; and spinning off excess liquid glass compound at an elevated temperature.

In accordance with a concomitant mode of the invention, there is the step of using at least one of quartz glass fibers and carbon fibers as the fibrous material of the fibers of the fiber mat.

Other features which are considered as characteristic for the invention are set forth in the appended claims.

Although the invention is illustrated and described herein as embodied in a method for producing a stable bond between two wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a cross-sectional view of a second exemplary embodiment of the two wafers lying one on top of the other in a sandwich-like manner and fibers disposed in between.

DESCRIPTION OF THE PREFERRED EMBODIMENTS

Figure 1:
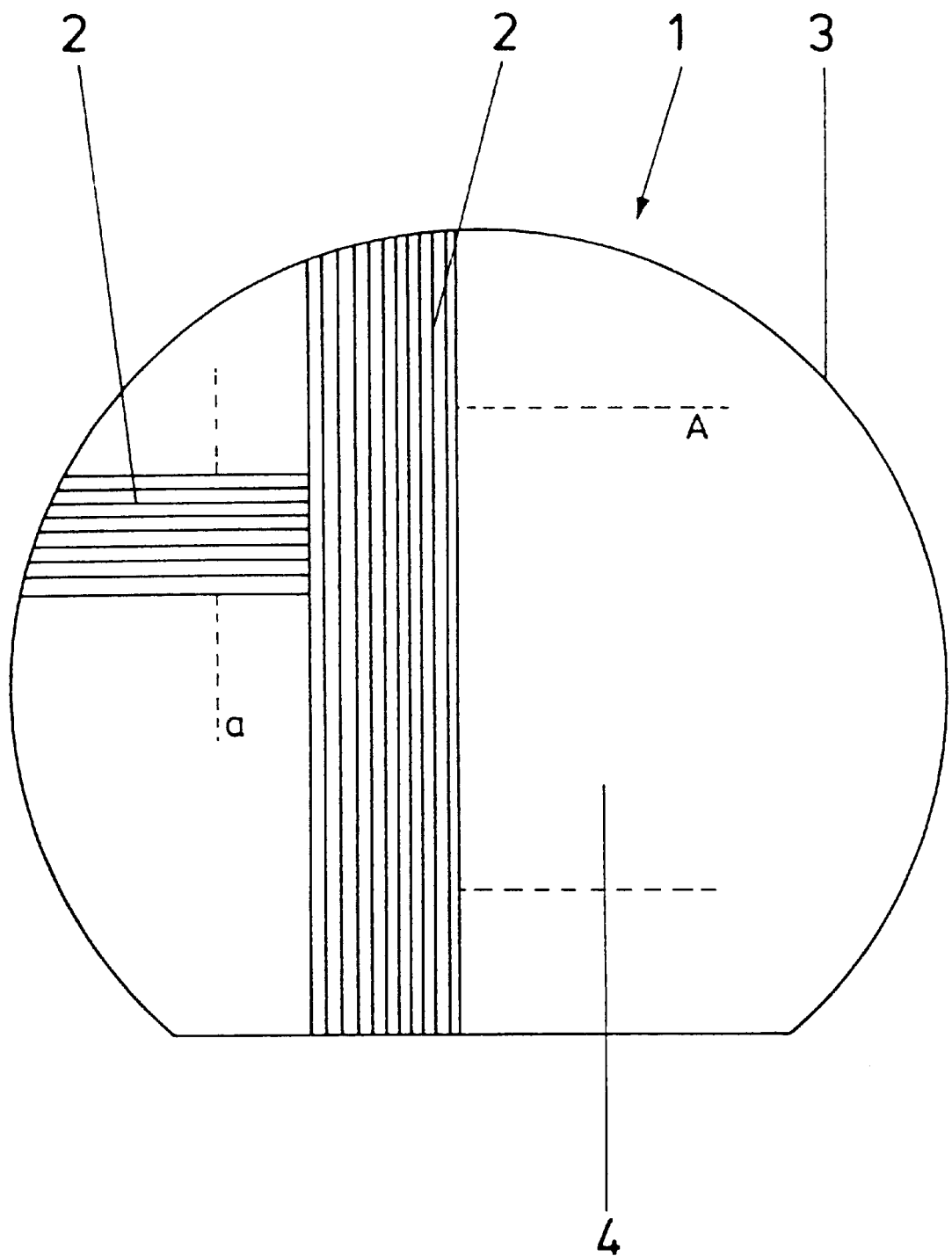
FIG. 1 is a diagrammatic, plan view of a support wafer according to the invention.

In all the figures of the drawing, sub-features and integral parts that correspond to one another bear the same reference symbol in each case. Referring now to the figures of the drawing in detail and first, particularly, to FIG. 1 thereof, there is shown a plan view of a support wafer 1, which contains an oxidizable semiconductor material—for example silicon or silicon carbide. The support wafer 1 advantageously has a polished surface 4 that is as planar as possible and in which trenches 2 have been made. The trenches 2 may be made in the surface 4 of the support wafer 1 in a conventional way by wet-chemical or dry-chemical etching or be cut out in some other way, typically using a photoresist and etching technique.

The trenches 2 extend over the entire surface 4 of the support wafer 1, which is indicated by dashed lines A, i.e. they extend from one edge 3 of the support wafer 1 to the other. Although in FIG. 1 the trenches 2 are respectively disposed parallel and perpendicular to one another, the parallel or perpendicular configuration is by no means necessary: rather, the trenches 2 may also run obliquely in relation to one another or be disposed in an altogether more or less "random" manner. Consequently, any desired configuration of the trenches 2 in the plane of the surface 4 of the support wafer 1 would be conceivable. All that is important here is that, when the surface 4 of the support wafer 1 is covered by a further wafer, a product wafer 5 as it is known, the trenches 2 allow liquid and gaseous materials to enter and leave at virtually all points of the surface of the wafers 1, 5 lying in this way one on top of the other.

Figure 2:
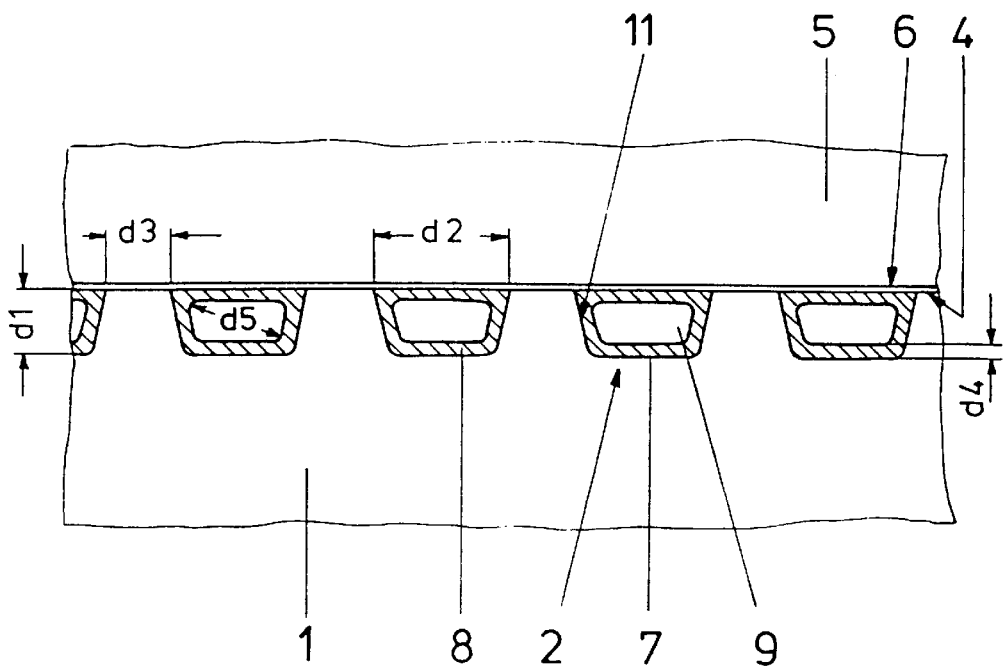
FIG. 2 is a sectional view of a first exemplary embodiment of two wafers lying one on top of the other in a sandwich-like manner.

FIG. 2 shows in a cross section an enlarged detail of a first exemplary embodiment of the two wafers 1, 5 disposed one on top of the other, one wafer being the support wafer 1 and the other wafer being the product wafer 5.

The trapezoidally formed trenches 2 have been made in the surface 4 of the support wafer 1. The trenches 2 have a depth d1 and a width d2 of typically 2 to 10 $\mu$m and are disposed at a distance d3 of between 1 and 10 $\mu$m from one another, but greater or smaller depths d1, widths d2 and distances d3 would also be conceivable. In the exemplary embodiment in FIG. 2, the trenches 2 have a rectangular or trapezoidal profile. It goes without saying that other trench profiles, such as for example a V-shaped, U-shaped, half-round, half-oval, square, polygonal or similar profile, are also conceivable.

The product wafer 5 is placed by its surface 6 over the surface 4 of the support wafer 1 in a more or less interlocking manner. Within the wafers 1, 5 lying one on top of the other in a "sandwich-like" manner, interspaces 7 are defined by the trenches 2. A thin film 8, which typically is formed of silicon dioxide, is applied to inner surfaces 11 of interspaces 7 and ensures a temperature-stable, re-releasable bond between the wafers 1, 5. The thin film 8, which is of a continuous form, that is to say completely covers the inner surfaces 11 of the interspaces 7, has the effect of defining voids 9 inside the interspaces 7.

Figure 3:
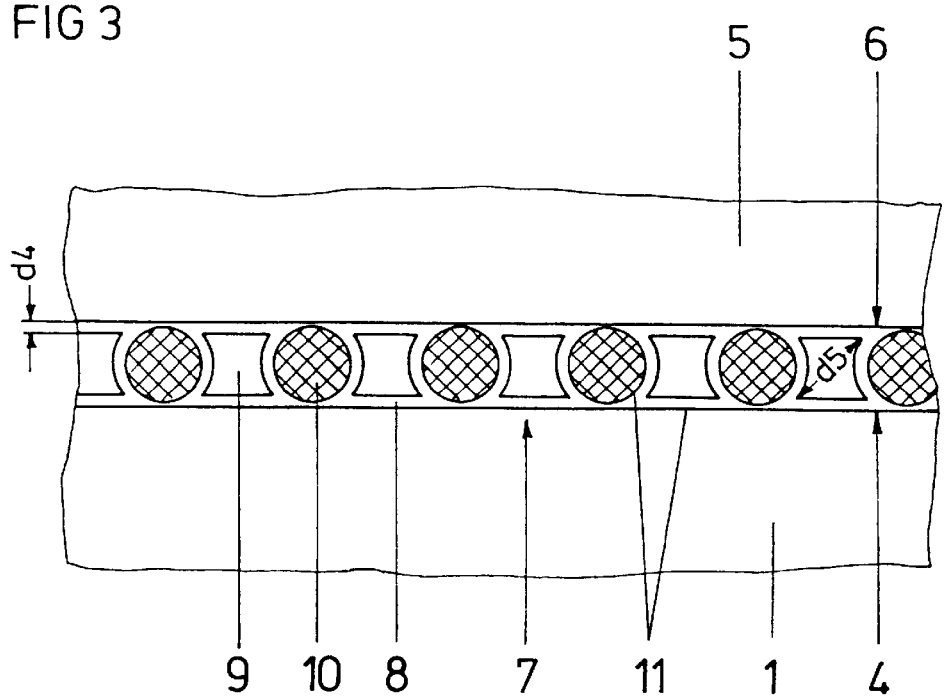

FIG. 3 shows in a cross section a second exemplary embodiment of two wafers 1, 5 disposed in a sandwich-like manner. The interspaces, denoted in FIG. 2 by the designation 7, do not necessarily have to take the form of trenches 2. Rather, they may advantageously also be created by the interspaces 7 of individual fibers 10 disposed next to one another more or less regularly, or an entire cluster of fibers 10 disposed in a fiber mat 10. The fibers 10—for example quartz glass fibers, carbon fibers or the like—are placed more or less in parallel onto the surface 4 of the support wafer 1 or of the product wafer 5. The other wafer 1, 5, respectively, is subsequently placed on in an interlocking manner. The special advantage is that the fibers 10 are at a more or less great distance d3 from one another, whereby interspaces 7 are defined between neighboring fibers 10. Here, too, voids 9 are formed inside the interspaces 7 by the continuous film 8.

In the production of a stable and re-releasable bond between the two wafers 1, 5 using the configuration according to FIG. 2 or 3, however, the following boundary conditions have to be observed.

For producing a bond which is stable at high temperatures and can be re-released, and consequently for achieving the object stated at the beginning, on the one hand there are geometrical restrictions, to be observed in respect of the surface topography, and on the other hand there are physical restrictions. The topographical restrictions are explained by the special aspects of the transformation of the liquid phase into the solid phase of a liquid glass to be used here, which is also generally referred to by the specific technical term spin-on glass. As a consequence, the special aspects are first presented, to allow the geometrical restrictions, which are the basis for the invention, then to be explained.

The transformation of a liquid glass compound into a silicon dioxide layer 8 with the desired mechanical and physical properties requires a surface on which the silicon dioxide layer 8 can also be deposited. On the other hand, it must be possible for the gaseous reaction products of the liquid glass to evaporate again sufficiently rapidly after the creation of the silicon dioxide layer 8. For this purpose, it is necessary that, after it has been distributed, the liquid glass is present as the thin film 8 which is as continuous as possible, the reason for this being that the gaseous reaction products only have to diffuse away from the location of the reaction through the thin film 8 before they are again in the gas phase of the system. In addition, it is necessary that the path from the boundary of the liquid/solid phase to the point of departure from the location of the reaction, that is the silicon dioxide film 8 stable at high temperatures, offers a sufficiently low flow resistance to the gaseous reaction products.

It must also be observed that the rigidity of the silicon dioxide film 8 is provided only if it adheres as a compact thin film on a suitable surface 11. If, in its final state, the silicon dioxide film 8 between two silicon wafers 1, 5 which is stable at high temperatures and for which the liquid glass is used is to contain too many self-supporting portions of the resulting silicon dioxide 8, the required rigidity is no longer readily achievable.

To ensure the strength of the bond between the support wafer 1 and the product wafer 5, it is absolutely necessary for a sufficiently large cross-sectional surface area of the silicon dioxide film 8 to be formed between the wafers 1, 5. Since, however, for the reasons mentioned, this may only be present as the thin film 8, the large cross-sectional surface area can be achieved only by a correspondingly fine structuring of the interspaces 7.

On the other hand, the structuring must be coarse enough for there to be between the wafers 1, 5 to be bonded the system of voids 9 into which, finally, hydrofluoric acid solution can penetrate for dissolving the silicon dioxide film 8 and consequently for separating the support wafer 1 and the product wafer 5. Furthermore, the etching advancement must also be ensured by sufficiently rapid diffusion away of the reaction products of the hydrofluoric acid etching.

With regard to the special purity demands of microelectronics, starting materials for the liquid glass compounds that have become established there and in principle are formed of more or less polymerized high-purity silicon alkoxides would be suitable.

The method according to the invention is explained in more detail below with reference to the drawings.

The trenches 2 or the interspaces 7 should be disposed in such a way that the liquid glass initially fills entirely the voids 9 which are represented in the cross section of FIGS. 2 and 3 and are formed by the support wafer 1 and the ultrathin or to-be-thinned product wafer 5. Subsequently, spinning, that is to say centrifugal force, can be used to spin off the greater part of the liquid glass until there remains a continuous film 8 which wets all the inner surfaces 11 and a thickness d4 of which is suitable for transforming the material under the slow action of temperature into the silicon dioxide film 8 in precisely the same way as if the liquid glass had been conventionally spun from above onto a planar wafer surface.

The diameter d5 of the trenches 2 forming the voids 9 disposed as radially as possible is preferably to be dimensioned such that the liquid glass compound initially penetrates from outside of its own accord, by capillary action, to leave behind subsequently, when centrifugal force is applied by rotation, the desired wetting liquid glass film 8. It goes without saying that the trenches 2 or the interspaces 7 must be sufficiently large that the hydrofluoric acid solution can penetrate everywhere into the trenches 2 or the interspaces 7 when the silicon dioxide film 8 formed by the liquid glass compound dissolves, and consequently the transporting away of the reaction products produced during the etching away of the silicon dioxide is not hindered.

On the other hand, with regard to the dimensioning of the voids 9 it is necessary to find the balance where their size and number produce a strung-together line which is as great as possible, to maximize the force transmission between the two wafers 1, 5 lying one on top of the other. To achieve this aim in connection with the fact that the liquid glass, after its spinning-on and drying operation, is present as the thin silicon dioxide film 8 of the order of several hundred nanometers to a few micrometers, it is advantageous if semiconductor devices possibly introduced on the product wafer 5 have structure heights in the surface topography which are less than the film thickness d4 of the silicon dioxide film 8.

An alternative method to achieve the geometrical boundary conditions for producing the silicon dioxide film 8 from the liquid glass compound is described below.

If the fibers 10 disposed more or less regularly and in parallel are positioned in a way corresponding to FIG. 3 between the support wafer 1 and the product wafer 5, they are likewise capable of providing a sufficiently large inner surface 11 between the two wafers 1, 5, along which the liquid glass compound can orient itself and produce the desired stable bond.

Glass fibers can be advantageously used for this purpose. Glass fibers are a suitable starting material simply because melts with a minimal content of alkali ions are preferably used for their production. Borosilicate glasses are particularly well suited here, since the coefficient of thermal expansion of the glass fibers can be suitably adjusted by the boron content. Alternatively, carbon fibers may in principle also be used here. For applications that lie above the glass softening point, various quartz fiber products are also suitable.

In semiconductor technology, wafers with increasingly large diameters are being used to an increasing extent. This trend is accompanied by the technological difficulty of spinning on or spinning off liquid compounds as uniformly as possible over the entire surface of a wafer. For this reason, a third, particularly advantageous method according to the invention for producing a temperature-stable, re-releasable bond between two wafers, which allows in particular for the problem of uniform spinning off/on in the case of large wafer diameters, is described below.

Here, preferably one or more alkali-free thin fiber mats are provided for a framework bonding the two wafers 1, 5. The fibers 10 of the thin fiber mats 10 may be disposed essentially randomly. Glass fibers, carbon fibers or quartz fibers are likewise suitable here as the fibers 10, the latter being very easy to obtain under the trade name quartz fiber paper.

According to this particular exemplary embodiment of the method according to the invention, the fiber mats 10 are first wetted with the liquid glass compound, only then to be positioned between the two wafers 1, 5. It is particularly advantageous if in this operation the defined thin film 8 is already provided on the fibers of the fiber mat 10. It would be possible in this case to dispense with the spinning-off operation required in the previous exemplary embodiments. This is a particular advantage, since the method according to the invention can consequently be carried out to the greatest extent independently of the diameter of the wafers 1, 5. In addition, by dispensing with a step in the process, handling time and consequently the costs for the spinning-off equipment can also be saved.

The adjustment mentioned above of the film thickness d4 on the fibers of the fiber mat 10 can be achieved for example by impregnating the fiber mats 10 with the liquid glass and possibly also subjecting them to a centrifugal force in the direction normal to their plane, for the purpose of further adjusting the thickness d4 of the thin film 8. After this, the fiber mats 10 impregnated in a specifically selective manner with the liquid glass compound can be temporarily stored at a temperature of several Kelvins below the freezing point until they are used. The low-temperature storage is advantageous on the one hand because the liquid glass compound then becomes chemically more stable. On the other hand, a higher viscosity of the thin film 8 can be obtained in this way. To be able to utilize the temperature dependence of the viscosity of the liquid glass compound, there is also the possibility of carrying out the operation of wetting the fiber mat 10 at an elevated temperature.

In all cases, it would also be conceivable if a thin oxide, not represented in the drawing, were applied to the surface 4 of the support wafer 1 and/or of the product wafer 5. In this case, the growth of the thin silicon dioxide film 8 can be additionally increased further.

To sum up, it may be stated that the method according to the invention, as described above, for producing a bond between the two wafers which is stable at high temperatures and for handling wafers subsequently ground until they are thin allows the conventional equipment of silicon technology to be used virtually without any additional expenditure in a customary way, without at the same time having to accept the disadvantages of prior-art methods.

The present invention has been presented on the basis of the above description in such a way as to explain best the principle of the invention and its practical application. It goes without saying that the method according to the invention can be modified in a suitable way in diverse embodiments within the scope of the activities and expertise of a person skilled in the art.

We claim:

1. A method for producing a releasable bond being stable at high temperatures and being mechanically stable, which comprises the steps of:

placing two wafers to be bonded one on top of another such that a surface of a first wafer is disposed on a surface of a second wafer, resulting in a creation of interspaces between the two wafers, the interspaces at least partially connecting the surface of the first wafer to the surface of the second wafer;

introducing a liquid glass compound into the interspaces forming a liquid glass film wetting inner surfaces of the interspaces, in which process, voids connected to an atmosphere surrounding the two wafers remain inside the interspaces wetted with the liquid glass compound; and subjecting the two wafers lying one on top of the other to a temperature treatment to transform the liquid glass film into a solid silicon dioxide film, thereby forming a releasable bond being mechanically stable and stable at high temperatures.

2. The method according to claim 1, which comprises carrying out the temperature treatment step for turning the liquid glass film into the solid silicon dioxide film at a temperature of between 120° C. and 450° C.

3. The method according to claim 2, which comprises subjecting the two wafers lying one on top of the other to a uniform pressure over a large surface area during the temperature treatment step.

4. The method according to claim 1, which comprises using the first wafer as a support for the second wafer, the second wafer, on which semiconductor devices to be created are provided, being one of ground until thin and etched until thin after a production of the bond.

5. The method according to claim 1, which comprises forming trenches running in a plane of one of the surface of the first wafer and the surface of the second wafer.

6. The method according to claim 5, which comprises forming the trenches such that they run at least one of parallel and perpendicular to one another.

7. The method according to claim 5, which comprises forming the trenches to have a depth of from 2 $\mu$m to 10 $\mu$m and at a distance of from 1 $\mu$m to 10 $\mu$m from one another.

8. The method according to claim 5, which comprises forming the trenches to have a cross section selected from the group consisting of rectangular cross sections and trapezoidal cross sections.

9. A method for producing a releasable bond between two wafers, the bond being stable at high temperatures and being mechanically stable, the method which comprises the steps of:

applying a layer of liquid glass compound to one of the two wafers;

subsequently placing the two wafers one on top of the other in an interlocking and frictionally engaging manner to create a liquid glass film;

spinning off excess liquid glass compound located in interspaces between the two wafers by high-speed rotation of the two wafers, utilizing a centrifugal force, with voids communicating with an atmosphere surrounding the two wafers remaining inside the interspaces wetted with the liquid glass compound; and subjecting the two wafers lying one on top of the other to a temperature treatment to transform the liquid glass film into a solid silicon dioxide film, for forming a releasable bond being mechanically stable and stable at high temperatures.

10. The method according to claim 1, which comprises:

placing the two wafers one on top of the other in an interlocking and frictionally engaging manner;

disposing the two wafers in a liquid glass reservoir such that the liquid glass compound can penetrate into the interspaces, utilizing capillary suction; and spinning off excess liquid glass compound located in the interspaces by high-speed rotation of the two wafers, utilizing centrifugal force to create the liquid glass film.

11. The method according to claim 1, which comprises forming a through hole in at least one of the two wafers;

placing the two wafers one on top of the other in an interlocking and frictionally engaging manner;

introducing the liquid glass compound through the through hole into the interspaces between the two wafers; and spinning off excess liquid glass compound located in the interspaces by high-speed rotation of the two wafers, utilizing centrifugal force, to create the liquid glass film.

12. The method according to claim 9, which comprises spinning the liquid glass compound onto the wafers at an elevated temperature.

13. The method according to claim 9, which comprises spinning off excess liquid glass compound at an elevated temperature.

14. The method according to claim 1, which comprises disposing a multiplicity of fibers between the two wafers, and regions between neighboring fibers forming the interspaces.

15. The method according to claim 1, which comprises placing a fiber mat produced from a fibrous material between the two wafers, regions between fibers of the fiber mate forming the interspaces.

16. The method according to claim 15, which comprises:

performing one of impregnating and wetting the fiber mat with the liquid glass compound before the fiber mat is placed between the two wafers;

subjecting the fiber mat impregnated with the liquid glass compound to a high-speed rotational movement normal to its plane, utilizing centrifugal force to adjust a film thickness of the fiber mat; and subsequently, placing the fiber mat in an interlocking and frictionally engaging manner between the two wafers.

17. The method according to claim 16, which comprises storing the fiber mat impregnated with the liquid glass compound under refrigerated conditions until the temperature treatment step to create the silicon dioxide film is performed.

18. The method according to claim 15, which comprises impregnating the fiber mat with the liquid glass compound at an elevated temperature.

19. The method according to claim 15, which comprises using at least one of quartz glass fibers and carbon fibers as the fibrous material of the fibers of the fiber mat.

* * * * *